(12) United States Patent
Lima

(10) Patent No.: US 11,549,205 B2
(45) Date of Patent: *Jan. 10, 2023

(54) NANOFIBER FABRIC

(71) Applicant: Lintec of America, Inc., Richardson, TX (US)

(72) Inventor: Marcio D. Lima, Richardson, TX (US)

(73) Assignee: LINTEC OF AMERICA, INC., Richardson, TX (US)

( * ) Notice: Subject to any disclaimer, the term of this patent is extended or adjusted under 35 U.S.C. 154(b) by 342 days.

This patent is subject to a terminal disclaimer.

(21) Appl. No.: 16/926,301

(22) Filed: Jul. 10, 2020

(65) Prior Publication Data

US 2020/0340157 A1 Oct. 29, 2020

Related U.S. Application Data

(63) Continuation of application No. 16/364,933, filed on Mar. 26, 2019, now Pat. No. 10,724,163.

(Continued)

(51) Int. Cl.
*D04H 1/74* (2006.01)
*D04H 1/593* (2012.01)
(Continued)

(52) U.S. Cl.
CPC ............ *D04H 1/74* (2013.01); *C01B 32/158* (2017.08); *D04H 1/4242* (2013.01);
(Continued)

(58) Field of Classification Search
CPC . C01B 2202/02; C01B 2202/06; C01B 32/15; C01B 32/158; D04H 1/4242;
(Continued)

(56) References Cited

U.S. PATENT DOCUMENTS 8,926,933 B2 1/2015 Zhang et al.
10,724,163 B2 * 7/2020 Lima ..................... D04H 1/587
(Continued)

FOREIGN PATENT DOCUMENTS

CN 102482076 A 5/2012
EP 3082248 A2 10/2016
(Continued)

OTHER PUBLICATIONS

Extended ESR for EP App. No. 19802987.8, dated Feb. 10, 2022.
(Continued)

*Primary Examiner* — Lawrence D Ferguson
(74) *Attorney, Agent, or Firm* — Greenblum & Bernstein, P.L.C.

(57) ABSTRACT

A fabric of nanofibers that includes an adhesive is described. The nanofibers can be twisted or both twisted and coiled prior to formation into a fabric. The adhesive can be selectively applied to or infiltrated within portions of the nanofibers comprising the nanofiber fabric. The adhesive enables connection of the nanofiber fabric to an underlying substrate, even in cases in which the underlying substrate has a three-dimensional topography, while the selective location of the adhesive on the fabric limits the contact area between the adhesive and the nanofibers of the nanofiber fabric. This limited contact area can help preserve the beneficial properties of the nanofibers (e.g., thermal conductivity, electrical conductivity, infra-red (IR) radiation transparency) that otherwise might be degraded by the presence of adhesive.

20 Claims, 10 Drawing Sheets

Related U.S. Application Data

(60) Provisional application No. 62/672,313, filed on May 16, 2018.

(51) Int. Cl.
    *D04H 1/587*     (2012.01)
    *D04H 1/64*     (2012.01)
    *H05K 9/00*     (2006.01)
    *C01B 32/158*     (2017.01)
    *D04H 1/4242*     (2012.01)

(52) U.S. Cl.
    CPC ............. *D04H 1/587* (2013.01); *D04H 1/593* (2013.01); *D04H 1/64* (2013.01); *H05K 9/009* (2013.01); *C01B 2202/02* (2013.01); *C01B 2202/06* (2013.01)

(58) Field of Classification Search
    CPC .......... D04H 1/587; D04H 1/593; D04H 1/64; D04H 1/74; D04H 3/04; D04H 3/045; D04H 3/12; H05K 9/009
    See application file for complete search history.

(56) References Cited

U.S. PATENT DOCUMENTS

| | | |
|---|---|---|
| 2005/0064185 A1 | 3/2005 | Buretea et al. |
| 2006/0024483 A1 | 2/2006 | Koch et al. |
| 2010/0304108 A1 | 12/2010 | Doshi et al. |
| 2010/0317790 A1 | 12/2010 | Jang et al. |
| 2012/0192931 A1 | 8/2012 | Jeon et al. |
| 2015/0224739 A1* | 8/2015 | Joo ........................ D04H 1/728 428/113 |
| 2016/0219874 A1* | 8/2016 | Yarin ........................ D01F 1/10 |
| 2017/0137290 A1 | 5/2017 | Zhang et al. |
| 2017/0283994 A1 | 10/2017 | Cooper et al. |
| 2018/0194920 A1 | 7/2018 | Lima et al. |
| 2019/0055677 A1 | 2/2019 | Lima |
| 2019/0352819 A1 | 11/2019 | Lima |

FOREIGN PATENT DOCUMENTS

| | | |
|---|---|---|
| KR | 20120078329 A | 7/2012 |
| TW | 201733783 A | 10/2017 |
| WO | WO 2007/015710 A2 | 2/2007 |
| WO | 2012008632 A1 | 1/2012 |
| WO | 2017048803 A1 | 3/2017 |
| WO | WO 2017/048813 A1 | 3/2017 |
| WO | 2019221822 A1 | 11/2019 |

OTHER PUBLICATIONS

Office Action for CN App. No. 201980032764.X, dated Jun. 8, 2022 (w/ translation).

Office Action for KR App. No. 10-2020-7034535, dated Mar. 24, 2022 (w/ translation).

International Search Report and Written Opinion received for PCT/US2019/024038. dated Jul. 18, 2019. 14 pages.

International Search Report and Written Opinion received for PCT/US2018/044732. dated Oct. 11, 2018. 24 pages.

International Preliminary Report on Patentability received for PCT/US2018/044732. dated Feb. 27, 2020. 10 pages.

\* cited by examiner

NANOFIBER FABRIC

RELATED APPLICATIONS

This application is a continuation of U.S. Non-Provisional patent application Ser. No. 16/364,933 entitled "NANOFIBER FABRIC," filed on Mar. 26, 2019, which claims priority under 35 USC § 119(e) to U.S. Provisional Patent Application No. 62/672,313 entitled "NANOFIBER FABRIC," filed on May 16, 2018, which are both incorporated by reference herein in their entirety.

TECHNICAL FIELD

The present disclosure relates generally to nanofibers. Specifically, the present disclosure relates to nanofiber fabrics made from nanofiber yarns.

BACKGROUND

Nanofiber forests, composed of both single wall and multiwalled nanotubes, can be drawn into nanofiber ribbons or sheets. In its pre-drawn state, the nanofiber forest comprises a layer (or several stacked layers) of nanofibers that are parallel to one another and perpendicular to a surface of a growth substrate. When drawn into a nanofiber sheet, the orientation of the nanofibers changes from perpendicular to parallel relative to the surface of the growth substrate. The nanotubes in the drawn nanofiber sheet connect to one another in an end-to-end configuration to form a continuous sheet in which a longitudinal axis of the nanofibers is parallel to a plane of the sheet (i.e., parallel to both of the first and second major surfaces of the nanofiber sheet). Individual nanofiber sheets can be from a few microns thick to tens of nanometers thick. Nanofiber sheets can then be spun into nanofiber yarns.

SUMMARY

Example 1 is a nanofiber fabric comprising: a first plurality of nanofibers oriented in a first direction; a second plurality of nanofibers oriented in a section direction different from the first direction, the second plurality of nanofibers in contact with the first plurality of nanofibers at a plurality of junctions; and adhesive accumulations on at least some of the plurality of junctions.

Example 2 includes the subject matter of Example 1, wherein an angle between the first direction and the second direction is from 45° to 135°.

Example 3 includes the subject matter of either of Example 1 or Example 2, wherein an angle between the first direction and the second direction is from 60° to 120°.

Example 4 includes the subject matter of any of the preceding Examples, wherein the nanofiber fabric is transparent to IR radiation.

Example 5 includes the subject matter of Example 4, wherein gaps formed in the nanofiber fabric between nanofibers oriented in the first direction and nanofibers oriented in the second direction are from 1 μm to 10 mm across.

Example 6 includes the subject matter of any of the preceding Examples, wherein the nanofiber fabric acts as a barrier to electromagnetic interference.

Example 7 includes the subject matter of any of the preceding Examples, wherein nanofibers of at least one of the first plurality and the second plurality comprise twisted nanofiber yarns.

Example 8 includes the subject matter of Example 7, wherein the twisted nanofiber yarns comprise false twisted nanofiber yarns.

Example 9 includes the subject matter of any of the preceding Examples, wherein the nanofibers of at least one of the first plurality and the second plurality comprises coiled nanofiber yarns.

Example 10 includes the subject matter of Example 9, wherein coils of the coiled nanofiber yarns enable at least some of the first plurality of nanofibers and the second plurality of nanofibers to maintain their orientation and position relative to one another by at least partially uncoiling when placed in contact with a substrate having a three dimensional topography.

Example 11 includes the subject matter of any of the preceding Examples, further comprising a frame, wherein at least some terminal ends of the first plurality of nanofibers and the second plurality of nanofibers are disposed; and wherein the adhesive accumulations are on at least some terminal ends of the first plurality of nanofibers and the second plurality of nanofibers, the terminal ends disposed on the frame.

Example 12 includes the subject matter of any of the preceding Examples, wherein at least some of the first plurality of nanofibers and the second plurality of nanofibers are infiltrated with an adhesive.

Example 13 includes the subject matter of Example 12, further comprising a first plurality of adhesive fillets on nanofibers of the first plurality of nanofibers in contact with corresponding nanofibers of the second plurality of nanofibers.

Example 14 includes the subject matter of Example 13, further comprising: a substrate in contact with nanofibers of the second plurality of nanofibers; and a second plurality of adhesive fillets in contact with both nanofibers of the second plurality of nanofibers and the substrate.

Example 15 includes the subject matter of any of the preceding Examples, further comprising a release liner having an adhesive energy of less than 40 dynes/cm, the release liner on at least one side of the nanofiber fabric.

Example 16 includes the subject matter of Example 15, wherein the release liner comprises a deformable sheet configured to deform to conform to a substrate having a three dimensional topography.

Example 17 includes the subject matter of any of the preceding Examples, wherein the adhesive accumulations comprise sol gel precursors.

Example 18 includes the subject matter of Example 17, wherein the sol gel precursors comprise silicon dioxide precursors and a solvent.

Example 19 includes the subject matter of any of the preceding Examples, wherein the first plurality of nanofibers are woven with the second plurality of nanofibers to form the nanofiber fabric.

Example 20 includes the subject matter of any of the preceding Examples, wherein the first plurality of nanofibers are disposed on a single side of the second plurality of nanofibers to form the nanofiber fabric.

Example 21 includes the subject matter of any of the preceding Examples, wherein nanofibers of the first plurality and nanofibers of the second plurality comprise carbon nanotubes.

Example 22 includes the subject matter of Example 21, wherein the carbon nanotubes comprise multiwalled carbon nanotubes.

Example 23 includes the subject matter of any of the preceding Examples, wherein nanofibers of the first plurality and nanofibers of the second plurality comprise a diameter of from 10 nm to 1 µm.

Example 24 is a nanofiber fabric comprising a release liner comprising a backing material and a first adhesive have a first adhesive strength; a plurality of nanofiber yarns disposed on the first adhesive of the release liner, wherein the nanofiber yarns are twisted and coiled nanofibers; and a second adhesive having a second adhesive strength greater than the first adhesive strength disposed on at least one of a surface of the nanofiber yarns of the plurality or within interiors of the nanofiber yarns between the twisted and coiled nanofibers.

Example 25 includes the subject matter of Example 24, wherein the plurality of nanofibers comprises a first plurality of parallel nanofibers oriented in a first direction and a second plurality of parallel nanofibers oriented in a second direction.

Example 26 includes the subject matter of Example 24, wherein an angle between the first direction and the second direction is from 45° to 135°.

Example 27 includes the subject matter of Example 25, wherein an angle between the first direction and the second direction is from 60° to 120°.

Example 28 includes the subject matter of any of Examples 24-27, wherein the nanofiber fabric is transparent to IR radiation.

Example 29 includes the subject matter of any of Examples 24-28, wherein the nanofiber fabric acts as barrier to electromagnetic interference.

Example 30 includes the subject matter of any of Examples 24-29, wherein twists and coils of the nanofiber yarns enable the plurality of nanofibers yarns to maintain their orientation and position relative to one another by at least partially uncoiling when placed in contact with a substrate having a three dimensional topography.

Example 31 includes the subject matter of any of Examples 24-30, wherein the first adhesive has an adhesive energy of less than 40 dynes/cm, the release liner on at least one side of the nanofiber fabric.

Example 32 includes the subject matter of Example 31, wherein the release liner comprises a deformable sheet configured to deform to conform to a substrate having a three dimensional topography.

Example 33 includes the subject matter of any of Examples 24-32, wherein the adhesive comprises sol gel precursors.

Example 34 includes the subject matter of Example 33, wherein the sol gel precursors comprise silicon dioxide precursors and a solvent.

Example 35 includes the subject matter of Example 33, wherein the sol gel precursors comprise aluminum oxide precursors and a solvent.

Example 36 includes the subject matter of Example 33, wherein the sol gel precursors comprise yttrium oxide precursors and a solvent.

Example 37 includes the subject matter of Example 33, wherein the sol gel precursors comprise zinc sulfide precursors and a solvent.

Example 38 is a method that includes placing a first plurality of nanofibers oriented in a first direction on a second plurality of nanofibers in a second direction different from the first direction, the first plurality and the second plurality in contact at a plurality of junctions to form a nanofiber fabric; applying adhesive to at least some of the plurality of junctions; and placing the nanofiber fabric in contact with a release liner.

Example 39 includes the subject matter of Example 38, further comprising conforming the nanofiber fabric and the release liner to a three dimensional surface, wherein the release liner and nanofiber fabric conform to the three dimensional surface.

Example 40 includes the subject matter of Example 39, wherein the nanofiber fabric conforms to features at least 10 µm in size on the three dimensional surface.

Example 41 includes the subject matter of Example 39, further comprising removing the release liner while leaving the nanofiber fabric on the three dimensional surface.

Example 42 includes the subject matter of Example 39, wherein the first plurality of nanofibers and the second plurality of nanofibers maintain their orientation to one another when conformed to the three dimensional surface.

Example 43 includes the subject matter of Example 39, further comprising: established electrical contact using the nanofiber fabric between two electrically isolated electrical conductors on the three dimensional surface.

Example 44 includes the subject matter of any of Examples 38-43, wherein at least some of the nanofibers of the first plurality or the second plurality are twisted and coiled nanofiber yarns.

Example 45 includes the subject matter of any of Examples 38-43, wherein applying the adhesive further comprises providing an aerosol of an adhesive to the nanofiber fabric, the aerosol accumulating on at least some junctions of the plurality of junctions.

Example 46 includes the subject matter of any of Examples 38-43, wherein applying the adhesive further comprises: infiltrating the nanofibers of the first plurality of nanofibers and the second plurality of nanofibers with the adhesive; and forming adhesive fillets on at least some of the plurality of junctions.

Example 47 includes the subject matter of Example 46, wherein the adhesive comprises sol gel precursors.

Example 48 includes the subject matter of Example 47, wherein the sol gel precursors comprise aluminum oxide precursors and a solvent.

Example 49 includes the subject matter of Example 47, wherein the sol gel precursors comprise yttrium oxide precursors and a solvent.

Example 50 includes the subject matter of Example 47, wherein the sol gel precursors comprise zinc sulfide precursors and a solvent.

Example 51 includes the subject matter of any of Examples 38-50, wherein placing the first plurality of nanofibers oriented in the first direction on the second plurality of nanofibers in the second direction different from the first direction further comprises weaving the first plurality of nanofibers with the second plurality of nanofibers to form the nanofiber fabric.

Example 52 is a nanofiber assembly that includes a substrate; a nanofiber disposed over the substrate; and a graphene sheet having a center portion, a first side portion and a second side portion on opposite sides of the center portion, a first end portion connected to the first side portion and a second end portion connected to the second side portion, wherein the center portion of the graphene sheet is in contact with a side of the nanofiber opposite the substrate, and the first and second end portions are in contact with the substrate.

Example 53 is a method of attaching a nanofiber to a substrate comprising: disposing a nanofiber on a substrate;

suspending graphene sheets in a solvent to form a graphene suspension; and applying the graphene suspension to the nanofiber on the substrate, at least one of the graphene sheets in the suspension attaching the nanofiber to the substrate.

The figures depict various embodiments of the present disclosure for purposes of illustration only. Numerous variations, configurations, and other embodiments will be apparent from the following detailed discussion. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. In short, the figures are provided merely to show example structures.

DETAILED DESCRIPTION

Overview

Embodiments of the present disclosure include a fabric of nanofibers (and/or nanofiber yarns) that further include an adhesive. In some embodiments, the nanofibers can be twisted or both twisted and coiled into nanofiber yarns prior to forming the nanofibers and/or nanofiber yarns into a fabric. In these embodiments, the twisting and/or coiling can facilitate stretching the nanofiber fabric so as to conform to a topography of a surface of an underlying substrate while enabling the nanofibers to maintain their original (i.e., prior to placing on and conforming to the substrate surface) position and orientation relative to one another. Furthermore, in some embodiments, an adhesive (or a non-adhesive attachment technique, such as a graphene sheet) can be selectively located on or within portions of the nanofibers of the nanofiber fabric. The adhesive (or other non-adhesive attachment) enables attachment of the nanofiber fabric to an underlying substrate while the selective location of the adhesive on the fabric limits the contact area between the adhesive and the nanofibers of the nanofiber fabric. This limited use of adhesive can help preserve the beneficial properties of the nanofibers (e.g., thermal conductivity, electrical conductivity, infra-red (IR) radiation transmissivity) that otherwise might be degraded by a more extensive presence of adhesive. Some embodiments described herein can be attached to one or more release liners to improve the convenience of storing, handling, and applying of a nanofiber fabric of the present disclosure to a substrate. Selective application of adhesive materials can be accomplished using methods described in PCT Publication No. WO 2019/0055677, which is incorporated by reference herein in its entirety.

Figure 1:
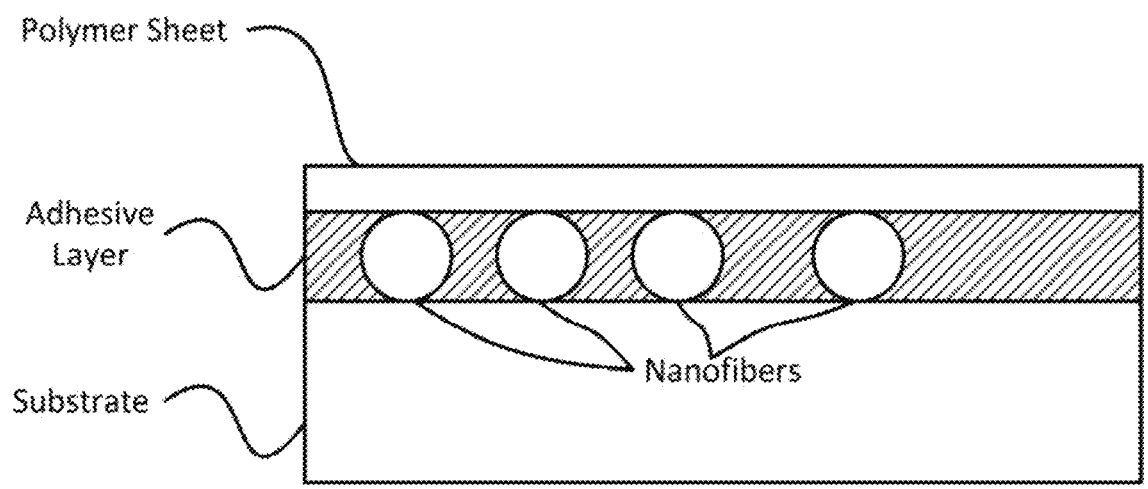
FIG. 1 illustrates an adhesive film in which nanofibers are encapsulated, the adhesive film and nanofibers attached to a substrate on one side and a polymer sheet on an opposing side.

Embodiments described herein are in contrast to many pre-existing configurations of nanofiber yarns, which embed nanofiber yarns within a polymer or completely coat nanofiber yarns with an adhesive. This is illustrated in FIG. 1, which shows nanofibers embedded within an adhesive layer and on a polymer sheet. While this configuration does make application of nanofiber yarns convenient, the adhesive layer (and in some cases the polymer sheet) can inhibit or otherwise degrade the advantageous properties of carbon nanofibers. For example, embedding nanofibers within an adhesive layer prevents (either in part or in whole) contact between the nanofibers and the underlying substrate. Without good physical contact, the unusually high electrical conductivity and thermal conductivity of the nanofiber yarns is isolated within the adhesive layer and thus is less likely to provide the benefit of these properties to the substrate (or the assembly as a whole). Furthermore, having an adhesive and/or polymer sheet coextensive with the nanofibers often reduces the transparency of the combined polymer sheet and nanofibers to some wavelengths of radiation (e.g., IR radiation).

Prior to describing nanofiber fabrics of the present disclosure, a description of nanofiber forests and sheets follows.

Nanofiber Forests

Figure 3:
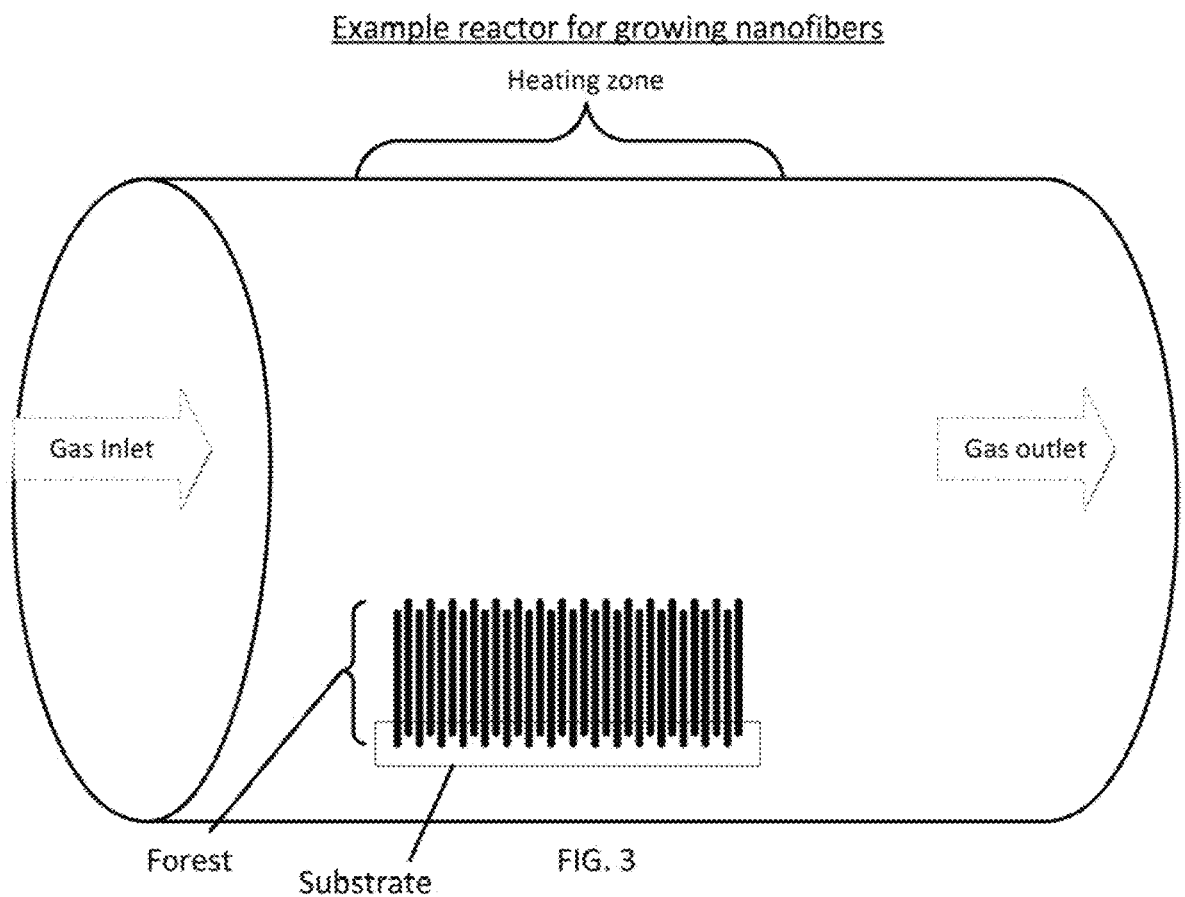
FIG. 3 schematically illustrates one example of a reactor for growing nanofibers, in an embodiment.

As used herein, the term "nanofiber" means a fiber having a diameter less than 1 µm. While the embodiments herein are primarily described as fabricated from carbon nanotubes, it will be appreciated that other carbon allotropes, whether graphene, micron or nano-scale graphite fibers and/or plates, and even other compositions of nano-scale fibers such as boron nitride may be densified using the techniques described below. As used herein, the terms "nanofiber" and "carbon nanotube" encompass both single walled carbon nanotubes and/or multi-walled carbon nanotubes in which carbon atoms are linked together to form a cylindrical structure. In some embodiments, carbon nanotubes as referenced herein have between 4 and 10 walls. As used herein, a "nanofiber sheet" or simply "sheet" refers to a sheet of nanofibers aligned via a drawing process (as described in PCT Publication No. WO 2007/015710, and incorporated by reference herein in its entirety) so that a longitudinal axis of a nanofiber of the sheet is parallel to a major surface of the sheet, rather than perpendicular to the major surface of the sheet (i.e., in the as-deposited form of the sheet, often referred to as a "forest"). This is illustrated and shown in FIGS. 3 and 4, respectively.

The dimensions of carbon nanotubes can vary greatly depending on production methods used. For example, the diameter of a carbon nanotube may be from 0.4 nm to 100 nm and its length may range from 10 µm to greater than 55.5 cm. Carbon nanotubes are also capable of having very high aspect ratios (ratio of length to diameter) with some as high as 132,000,000:1 or more. Given the wide range of dimensional possibilities, the properties of carbon nanotubes are highly adjustable, or "tunable." While many intriguing properties of carbon nanotubes have been identified, harnessing the properties of carbon nanotubes in practical applications requires scalable and controllable production methods that allow the features of the carbon nanotubes to be maintained or enhanced.

Due to their unique structure, carbon nanotubes possess particular mechanical, electrical, chemical, thermal and optical properties that make them well-suited for certain applications. In particular, carbon nanotubes exhibit superior electrical conductivity, high mechanical strength, good thermal stability and are also hydrophobic. In addition to these properties, carbon nanotubes may also exhibit useful optical properties. For example, carbon nanotubes may be used in light-emitting diodes (LEDs) and photo-detectors to emit or detect light at narrowly selected wavelengths. Carbon nanotubes may also prove useful for photon transport and/or phonon transport.

Figure 2:
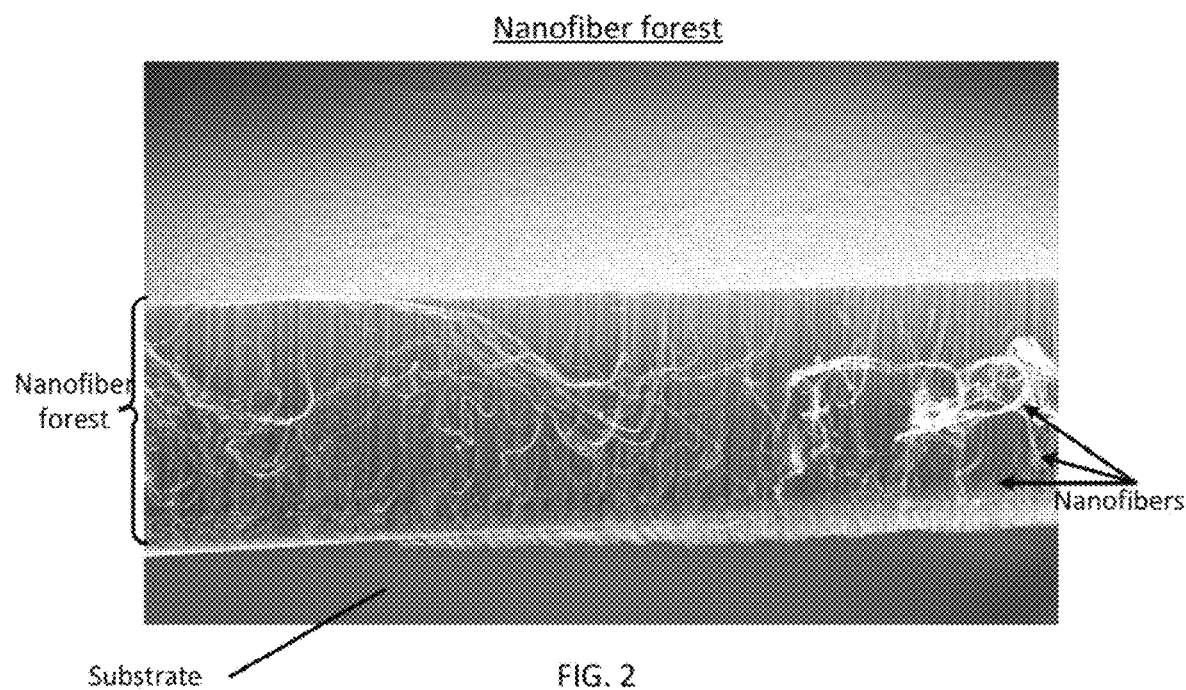
FIG. 2 illustrates an example forest of nanofibers on a substrate, in an embodiment.

In accordance with various embodiments of the subject disclosure, nanofibers (including but not limited to carbon nanotubes) can be arranged in various configurations, including in a configuration referred to herein as a "forest." As used herein, a "forest" of nanofibers or carbon nanotubes refers to an array of nanofibers having approximately equivalent dimensions that are arranged substantially parallel to one another on a substrate. FIG. 2 shows an example forest of nanofibers on a substrate. The substrate may be any shape but in some embodiments the substrate has a planar surface on which the forest is assembled. As can be seen in FIG. 2, the nanofibers in the forest may be approximately equal in height and/or diameter. In some cases the forest may be "as deposited" meaning that the nanotubes were formed on the substrate, or in other cases may have been transferred from the growth substrate onto a secondary substrate.

Nanofiber forests as disclosed herein may be relatively dense. Specifically, the disclosed nanofiber forests may have a density of at least 1 billion nanofibers/cm$^2$. In some specific embodiments, a nanofiber forest as described herein may have a density of between 10 billion/cm$^2$ and 30 billion/cm$^2$. In other examples, the nanofiber forest as described herein may have a density in the range of 90 billion nanofibers/cm$^2$. The forest may include areas of high density or low density and specific areas may be void of nanofibers. The nanofibers within a forest may also exhibit inter-fiber connectivity. For example, neighboring nanofibers within a nanofiber forest may be attracted to one another by van der Waals forces. Regardless, a density of nanofibers within a forest can be increased by applying techniques described herein.

Methods of fabricating a nanofiber forest are described in, for example, PCT No. WO2007/015710, which is incorporated herein by reference in its entirety.

Various methods can be used to produce nanofiber precursor forests. One example method, illustrated schematically in FIG. 3, includes growing nanofibers in a high-temperature furnace. In some embodiments, catalyst may be deposited on a substrate, placed in a reactor and then may be exposed to a fuel compound that is supplied to the reactor. Substrates can withstand temperatures of greater than 800° C. or even 1000° C. and may be inert materials. The substrate may comprise stainless steel or aluminum disposed on an underlying silicon (Si) wafer, although other ceramic substrates may be used in place of the Si wafer (e.g., alumina, zirconia, SiO$_2$, glass ceramics). In examples where the nanofibers of the precursor forest are carbon nanotubes, carbon-based compounds, such as acetylene may be used as fuel compounds. After being introduced to the reactor, the fuel compound(s) may then begin to accumulate on the catalyst and may assemble by growing upward from the substrate to form a forest of nanofibers. The reactor also may include a gas inlet where fuel compound(s) and carrier gasses may be supplied to the reactor and a gas outlet where expended fuel compounds and carrier gases may be released from the reactor. Examples of carrier gases include hydrogen, argon, and helium. These gases, in particular hydrogen, may also be introduced to the reactor to facilitate growth of the nanofiber forest. Additionally, dopants to be incorporated in the nanofibers may be added to the gas stream.

In a process used to fabricate a multilayered nanofiber forest, one nanofiber forest is formed on a substrate followed by the growth of a second nanofiber forest in contact with the first nanofiber forest. Multi-layered nanofiber forests can be formed by numerous suitable methods, such as by forming a first nanofiber forest on the substrate, depositing catalyst on the first nanofiber forest and then introducing additional fuel compound to the reactor to encourage growth of a second nanofiber forest from the catalyst positioned on the first nanofiber forest. Depending on the growth methodology applied, the type of catalyst, and the location of the catalyst, the second nanofiber layer may either grow on top of the first nanofiber layer or, after refreshing the catalyst, for example with hydrogen gas, grow directly on the substrate thus growing under the first nanofiber layer. Regardless, the second nanofiber forest can be aligned approximately endto-end with the nanofibers of the first nanofiber forest although there is a readily detectable interface between the first and second forest. Multi-layered nanofiber forests may include any number of forests. For example, a multi-layered precursor forest may include two, three, four, five or more forests.

Nanofiber Sheets

Figure 4A:
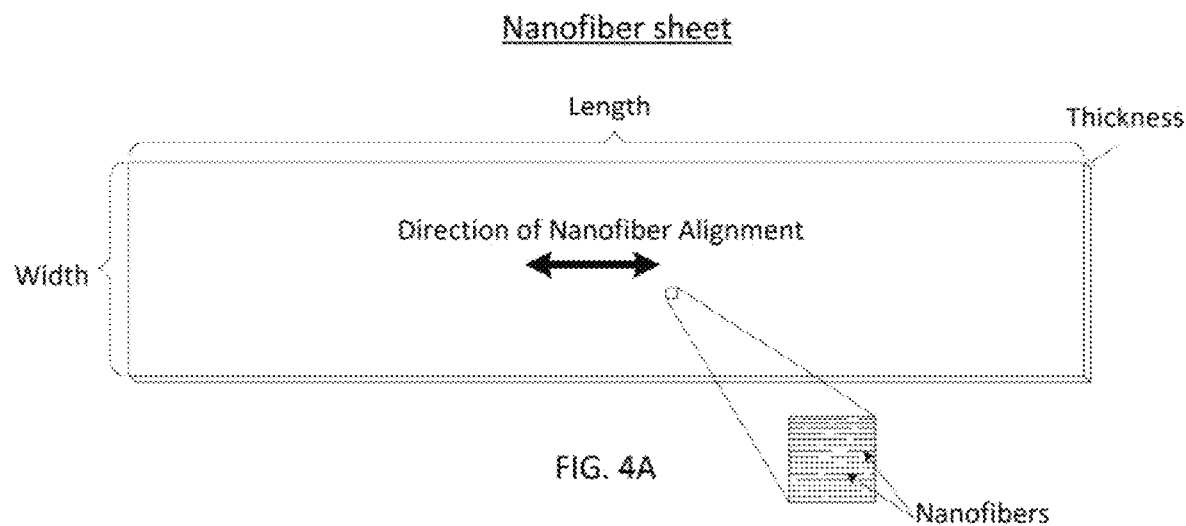
FIG. 4A is an illustration of a nanofiber sheet that identifies relative dimensions of the sheet and schematically illustrates nanofibers within the sheet aligned end-to-end in a plane parallel to a surface of the sheet, in an embodiment.

In addition to arrangement in a forest configuration, the nanofibers of the subject application may also be arranged in a sheet configuration. As used herein, the term "nanofiber sheet," "nanotube sheet," or simply "sheet" refers to an arrangement of nanofibers where the nanofibers are aligned end to end in a plane. An illustration of an example nanofiber sheet is shown in FIG. 4A with labels of the dimensions. In some embodiments, the sheet has a length and/or width that is more than 100 times greater than the thickness of the sheet. In some embodiments, the length, width or both, are more than $10^3$, $10^6$ or $10^9$ times greater than the average thickness of the sheet. A nanofiber sheet can have a thickness of, for example, between approximately 5 nm and 30 µm and any length and width that are suitable for the intended application. In some embodiments, a nanofiber sheet may have a length of between 1 cm and 10 meters and a width between 1 cm and 1 meter. These lengths are provided merely for illustration. The length and width of a nanofiber sheet are constrained by the configuration of the manufacturing equipment and not by the physical or chemical properties of any of the nanotubes, forest, or nanofiber sheet. For example, continuous processes can produce sheets of any length. These sheets can be wound onto a roll as they are produced.

As can be seen in FIG. 4A, the axis in which the nanofibers are aligned end-to end is referred to as the direction of nanofiber alignment. In some embodiments, the direction of nanofiber alignment may be continuous throughout an entire nanofiber sheet. Nanofibers are not necessarily perfectly parallel to each other and it is understood that the direction of nanofiber alignment is an average or general measure of the direction of alignment of the nanofibers.

Nanofiber sheets may be assembled using any type of suitable process capable of producing the sheet. In some example embodiments, nanofiber sheets may be drawn from a nanofiber forest. An example of a nanofiber sheet being drawn from a nanofiber forest is shown in FIG. 4B.

Figure 4B:
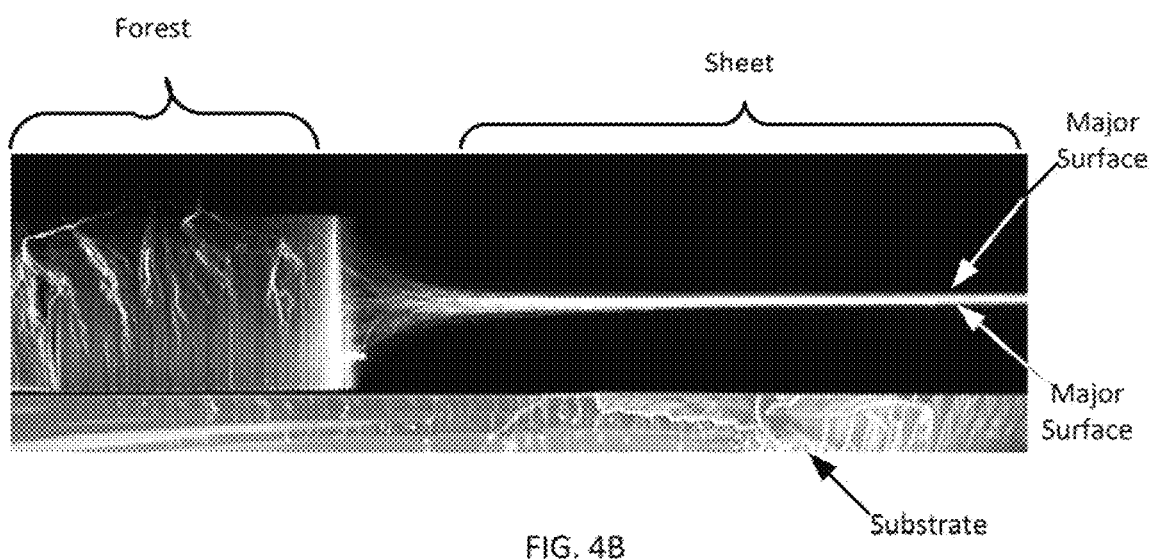
FIG. 4B is an image of a nanofiber sheet being laterally drawn from a nanofiber forest, the nanofibers aligning from end-to-end as schematically shown in FIG. 3.

As can be seen in FIG. 4B, the nanofibers may be drawn laterally from the forest and then align end-to-end to form a nanofiber sheet. In embodiments where a nanofiber sheet is drawn from a nanofiber forest, the dimensions of the forest may be controlled to form a nanofiber sheet having particular dimensions. For example, the width of the nanofiber sheet may be approximately equal to the width of the nanofiber forest from which the sheet was drawn. Additionally, the length of the sheet can be controlled, for example, by concluding the draw process when the desired sheet length has been achieved.

Nanofiber sheets have many properties that can be exploited for various applications. For example, nanofiber sheets may have tunable opacity, high mechanical strength and flexibility, thermal and electrical conductivity, and may also exhibit hydrophobicity. Given the high degree of alignment of the nanofibers within a sheet, a nanofiber sheet may be extremely thin. In some examples, a nanofiber sheet is on the order of approximately 10 nm thick (as measured within normal measurement tolerances), rendering it nearly two-dimensional. In other examples, the thickness of a nanofiber sheet can be as high as 200 nm or 300 nm. As such, nanofiber sheets may add minimal additional thickness to a component.

As with nanofiber forests, the nanofibers in a nanofibers sheet may be functionalized by a treatment agent by adding chemical groups or elements to a surface of the nanofibers of the sheet and that provide a different chemical activity than the nanofibers alone. Functionalization of a nanofiber sheet can be performed on previously functionalized nanofibers or can be performed on previously unfunctionalized nanofibers. Functionalization can be performed using any of the techniques described herein including, but not limited to CVD, and various doping techniques.

Nanofiber sheets, as drawn from a nanofiber forest, may also have high purity, wherein more than 90%, more than 95% or more than 99% of the weight percent of the nanofiber sheet is attributable to nanofibers, in some instances. Similarly, the nanofiber sheet may comprise more than 90%, more than 95%, more than 99% or more than 99.9% by weight of carbon.

Nanofiber Fabric With Selectively Located Adhesive

As indicated above, embodiments of the present disclosure include a fabric of nanofibers. The nanofibers of the fabric can be twisted, coiled, false twisted or any combination thereof, thus forming nanofiber yarns. The nanofiber fabric examples described herein are configured so as to enable stretching of the fabric over an underlying surface (generically referred to as a "substrate") that has a three-dimensional topography while also preserving the orientation and position of the nanofibers of the fabric to each other. While some of the embodiments described herein refer to nanofiber yarns, it will be appreciated that untwisted and/or uncoiled nanofibers, ribbons, sheets, or bundles may alternatively be used to form the nanofiber fabrics described herein and that reference to nanofiber yarns is merely for convenience of explanation. Furthermore, nanofiber fabrics described herein can be formed by weaving nanofibers together (e.g., having a warp and weft) or can be formed by placing one plurality of nanofibers oriented in a first direction on only one side of a second plurality of nanofibers oriented in a second direction.

The nanofibers of the fabric further include an adhesive that is selectively disposed on and/or within the nanofibers of the fabric. Selectively disposing the adhesive on the nanofibers of the fabric helps preserve nanofiber properties that would otherwise be degraded by more uniform application of the adhesive on the nanofibers.

Figure 5A:
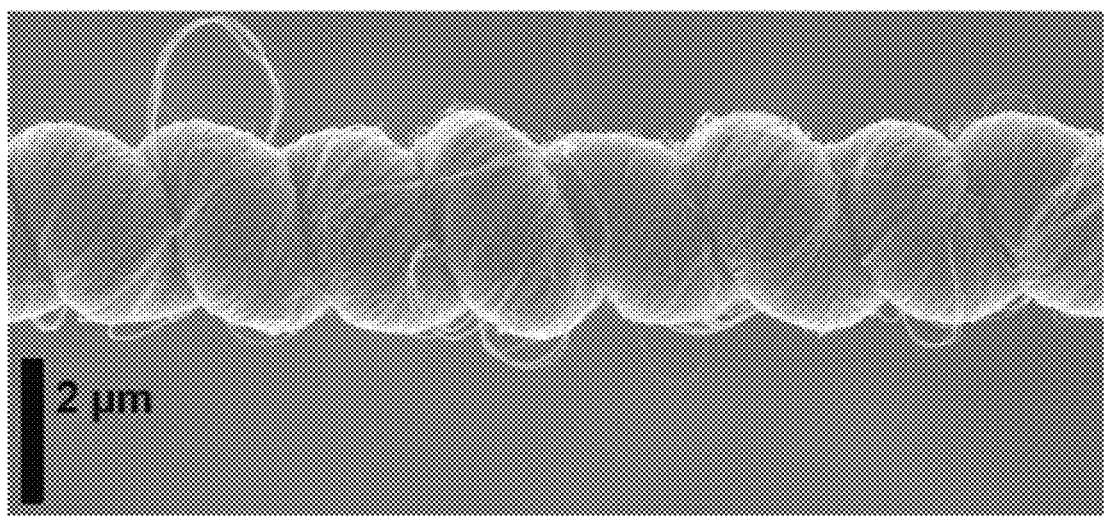
FIG. 5A is scanning electron microscope (SEM) magnified view of a nanofiber yarn comprising nanofibers that have been twisted together, the nanofiber yarn also including coils, in an embodiment.

FIG. 5A illustrates one example of a nanofiber used in a fabric of the present disclosure, wherein the nanofiber is configured as a nanofiber yarn that is both twisted and coiled. As can be appreciated in this SEM photomicrograph, twisting nanofibers together can bind the individual nanofibers into a yarn. Coils can be formed by, for example, "over twisting" the yarn or winding the twisted yarn around a mandrel, among other techniques. Regardless, the twists and coils within the nanofiber yarn essentially store length of the yarn in a compact form. That is, the twisted and coiled yarn having a first length can be extended to a second length longer than the first length by causing the uncoiling and/or untwisting of the yarn. Nanofiber yarns like the one shown in FIG. 5A can be woven into a fabric, as shown in the schematic illustration of FIG. 5B. As shown in this figure, nanofiber yarns oriented in a first direction (the weft) are woven together with nanofiber yarns oriented in the second direction (the warp) that is at an angle Θ to the first direction. This produces a two-dimensional array of nanofiber yarns, also referred to herein as a nanofiber fabric. In the example shown in FIG. 5B, the angle Θ is approximately 90° (+/−5° or within normal manufacturing variation). It will be appreciated that the angle Θ can be greater or less than 90° depending on the type and weave of fabric, and that the one shown is for convenience of illustration. For example, the angle Θ can be within any of the following ranges: from 30° to 165°; from 45° to 135°, 60° to 95°; and 60° to 165°. In various examples, a gap formed between the nanofiber yarns oriented in the first direction and the nanofiber yarns oriented in the second direction can be within any of the following ranges: 1 μm to 1 mm; 10 μm to 1 mm; 10 μm to 100 μm; 100 μm to 500 μm; 500 μm to 2 mm; 1 mm to 10 mm; more than 10 mm.

Figure 5B:
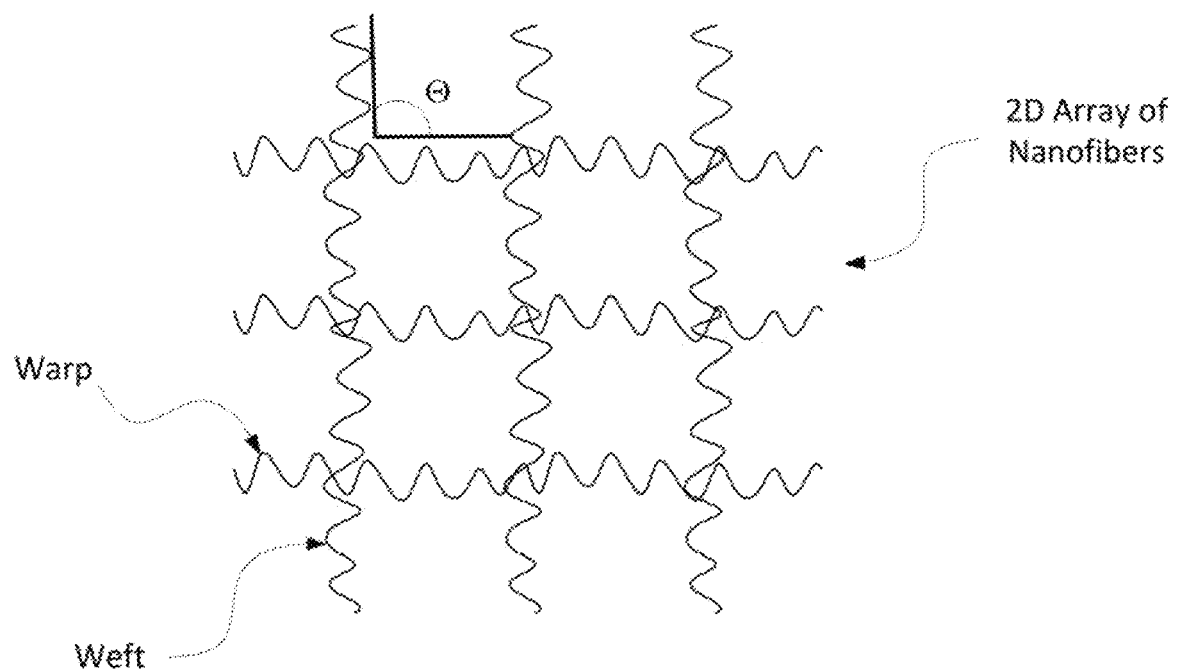
FIG. 5B illustrates a first plurality of nanofiber yarns oriented in a first direction and joined to a second plurality of nanofiber yarns oriented in a second direction at an angle O relative to the first direction thus forming a nanofiber fabric, in an embodiment.
Figure 5C:
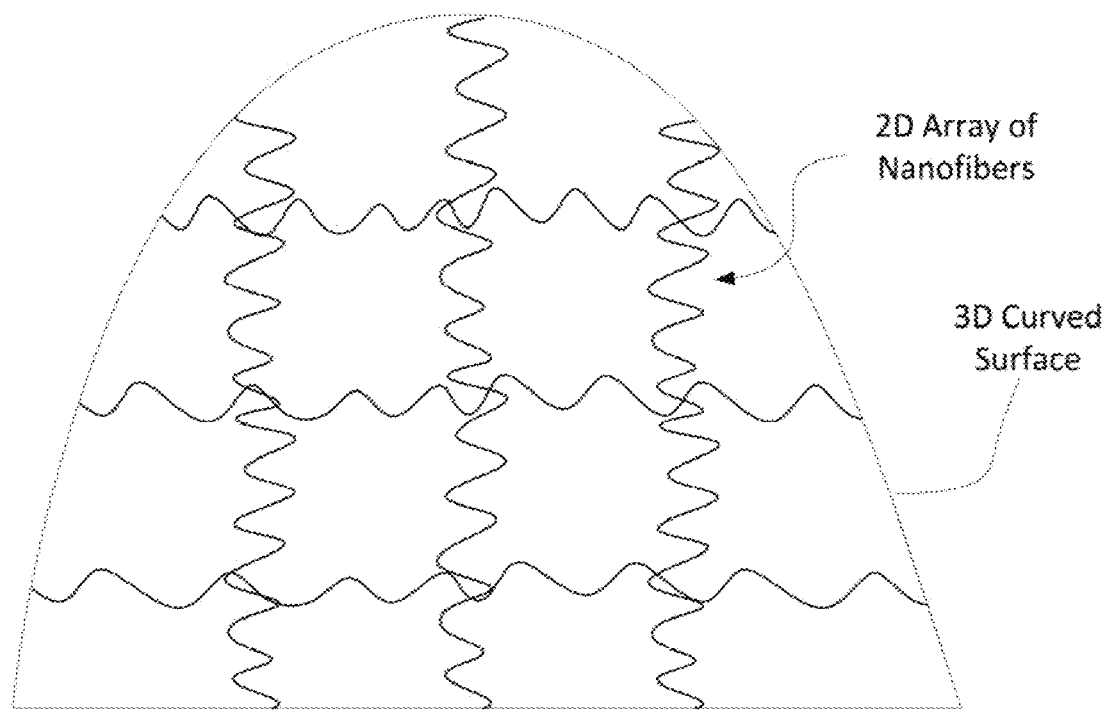
FIG. 5C illustrates a nanofiber fabric of FIG. 5B on a surface having a three dimensional (3D) topography, the nanofibers of the nanofiber fabric maintaining their orientation and position relative to one another even when disposed on the three dimensional surface, in an embodiment.

As shown in FIG. 5C, the nanofiber yarn fabric illustrated in FIG. 5B can be stretched over a substrate having a three-dimensional topography. As shown in this example, the nanofiber yarn fabric of FIG. 5B has been stretched over the curved surface in FIG. 5C. As is also schematically shown in FIG. 5C, the orientation and position of the nanofiber yarns of the nanofiber fabric is unchanged relative to the unstretched nanofiber fabric shown in FIG. 5B. That is, the angle Θ is the same or approximately the same (i.e., Θ+/−5°, e.g., 90° +/−5°) and the spacing between adjacent yarns of the weft and adjacent yarns of the warp is approximately unchanged (+/−5°) relative to the unstretched state shown in FIG. 5B. This is, as indicated above, because the nanofiber yarns can uncoil and/or untwist when stretched so as to accommodate the underlying topography without changing the orientation and position of the yarns relative to one another. In some examples, the nanofiber yarn fabric is compliant and conforms to a surface topography (whether on a flat surface or a curved surface) that is a small as 10 microns above or below a surrounding area of the surface.

The nanofiber yarn fabric of the present disclosure has the further benefit of having an adhesive selectively applied to portions of the nanofiber yarns (or alternatively, simply nanofibers), whether external portions or internal portions. As indicated above, this selective application is beneficial because it preserves many of the properties of the nanofibers that would otherwise be degraded by the presence of an adhesive. For example, by selectively applying the adhesive to some, but not all, portions of the nanofiber yarns and or nanofiber fabric, the nanofiber fabric can establish physical, electrical, and thermal contact with an underlying substrate without an intervening polymer and/or adhesive layer. In this way, the beneficial properties of the nanofiber fabric can be imparted to the underlying substrate without being degraded by an adhesive. In another example, the absence of an adhesive on significant portions of the nanofiber yarn and/or nanofiber fabric (e.g., greater than 50% of the surface area of the nanofibers, nanofiber yarns, and/or fabric) enables the nanofiber fabric to be adhered to an underlying substrate while preserving IR radiation transparency.

Figure 6A:
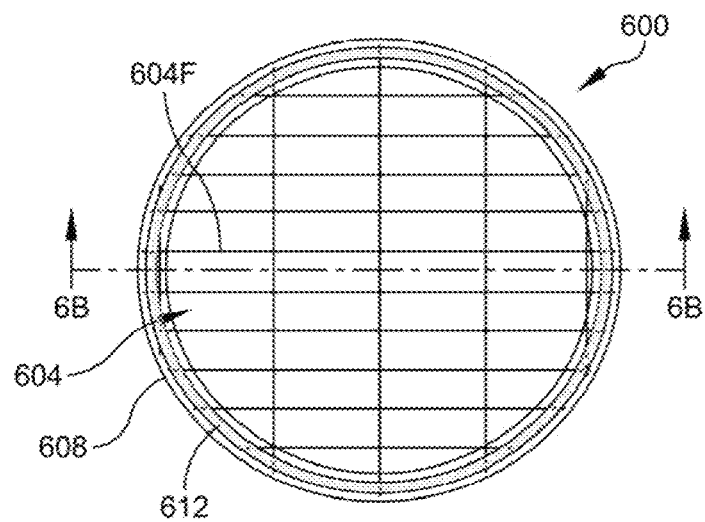
FIGS. 6A and 6B illustrate a plan view and a cross-sectional view, respectively, of a freestanding nanofiber fabric adhered to a frame at a perimeter of the freestanding nanofiber fabric, in an embodiment.
Figure 6B:
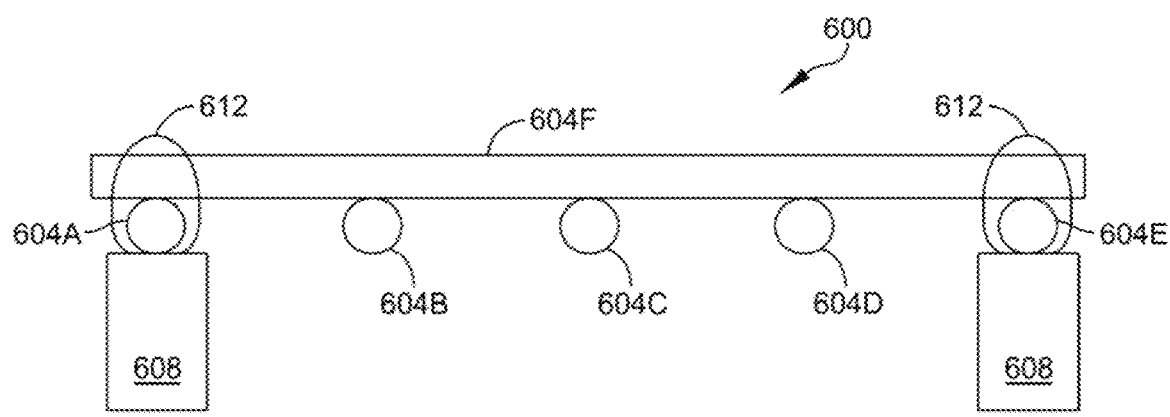
Figure 6C:
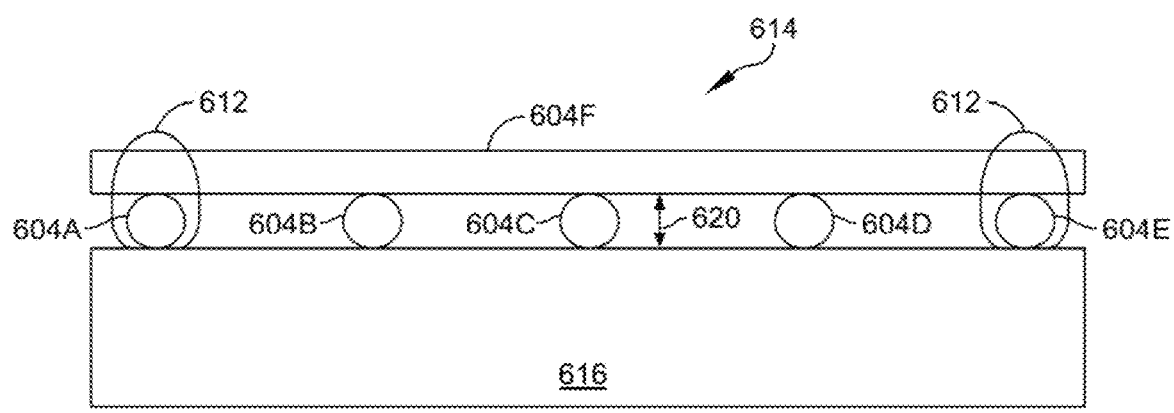
FIG. 6C illustrates a cross-sectional view of the nanofiber fabric of FIGS. 6A and 6B that has been removed from the frame and disposed on a substrate, in an embodiment.

The following description and corresponding figures illustrate various example embodiments of selective disposition of an adhesive on the nanofiber yarn fabric. FIGS. 6A, 6B, and 6C illustrate various views of a first example nanofiber fabric 600.

Turning first to FIG. 6A and concurrently to FIG. 6B (which is a cross-section of FIG. 6A at the location indicated in FIG. 6A), a nanofiber fabric 600 is illustrated that includes nanofiber yarns 604, a frame 608, and an adhesive layer 612 on the frame 608.

In this example, the nanofiber fabric 600 includes horizontal and vertical nanofiber yarns 604, analogous to the nanofiber fabric illustrated in FIG. 5B. As in the nanofiber fabric of FIG. 5B, it will be appreciated that the nanofiber yarns 604 can be at any angle and/or any orientation with respect to one another so as to form the nanofiber fabric 600 and not only in the orthogonal pattern shown in FIG. 5B or FIG. 6A. The vertical and horizontal orientation of the nanofiber yarns 604 illustrated in FIG. 6A (and as illustrated in the following examples) is merely for convenience of illustration.

The nanofiber fabric 600 is connected to the frame 608 via the adhesive layer 612. The adhesive layer 612 is disposed only on the surface of the frame and thus the adhesive layer 612 is selectively disposed on the nanofiber fabric 600 at peripheral locations of the nanofiber fabric that overlap with 612. This is shown in FIG. 6B, which illustrates nanofiber yarn 604F oriented in a first direction (horizontally in the plan view of FIG. 6A) in contact with nanofiber yarns 604A-604E oriented in a second direction (vertically in the plan view of FIG. 6A). The nanofiber yarn 604F intersects with nanofiber yarns 604A and 604E at peripheral edges of the fabric 600 and also overlaps the frame 608. Because the adhesive layer 612 is disposed on the frame 608, it is at these locations of fabric 600 and frame 608 overlap that the adhesive layer is selectively disposed on the nanofiber fabric 600. It will be appreciated that, in some cases, terminal ends of nanofiber yarns 604 that are not junctions between yarns in a first direction and a second direction but are merely ends of yarns can overlap with the frame 608. These terminal ends are in contact with a selectively applied adhesive layer 612 by this contact with the adhesive layer 612. Within the peripheral edge of the nanofiber fabric 600 (defined by contact with the adhesive layer 612 on the frame 608) is an interior of the nanofiber fabric 600 that is free of adhesive. A dimension of the adhesive layer 612 can be within any of the following dimensions: 1 μm to 1 mm; 10 μm to 1 mm; 10 μm to 100 μm; 100 μm to 500 μm; 500 μm to 2 mm; 1 mm to 10 mm; more than 10 mm.

This absence of adhesive on an interior of the nanofiber fabric 600 means that, as described above, direct physical, electrical, and thermal contact can be established between the nanofiber fabric 600 and an underlying substrate. This is illustrated in FIG. 6C. As shown, the frame 608 has been removed. The nanofiber fabric 600 has been applied to a substrate 616 via the adhesive 612 on the peripheral edge of the nanofiber fabric 600 to form an assembly 614, thus leaving an interior of the nanofiber fabric 600 on the substrate 616 free of adhesive or polymer. As mentioned above, properties such as thermal and electrical conductivity, and IR transparency of the nanofiber fabric 600 that would otherwise be impaired by the presence of an adhesive or polymer are not inhibited. A gap 620 between the substrate 616 and nanofiber yarn 604F having a height corresponding to a diameter of the nanofiber yarn 604 is also shown in FIG. 6C.

Figure 7A:
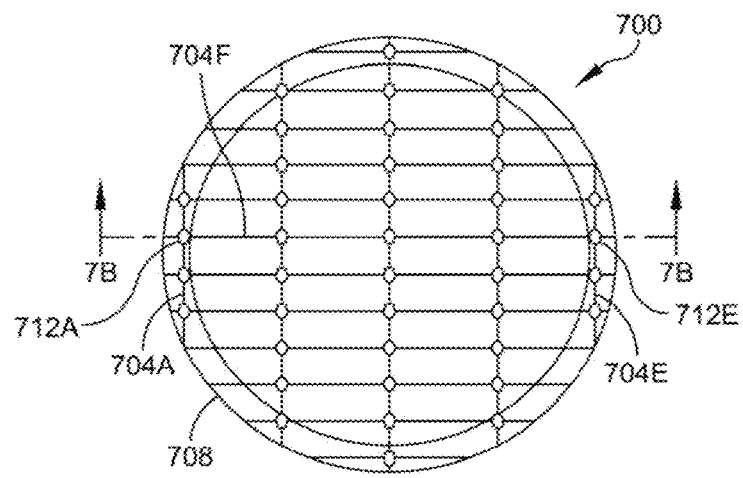
FIGS. 7A and 7B illustrate a plan view and a cross-sectional view, respectively, of a freestanding nanofiber fabric adhered to a frame, wherein a plurality of adhesive accumulations are disposed at junctions between nanofibers, in an embodiment.
Figure 7B:
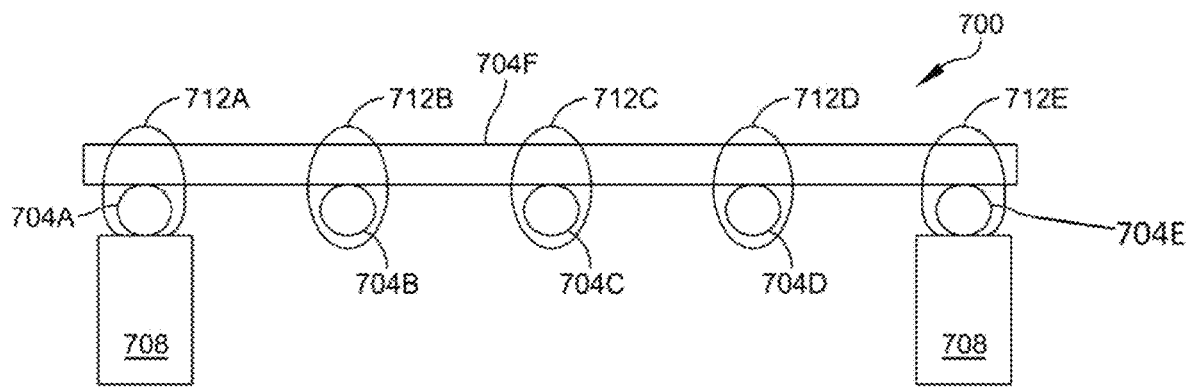
Figure 7C:
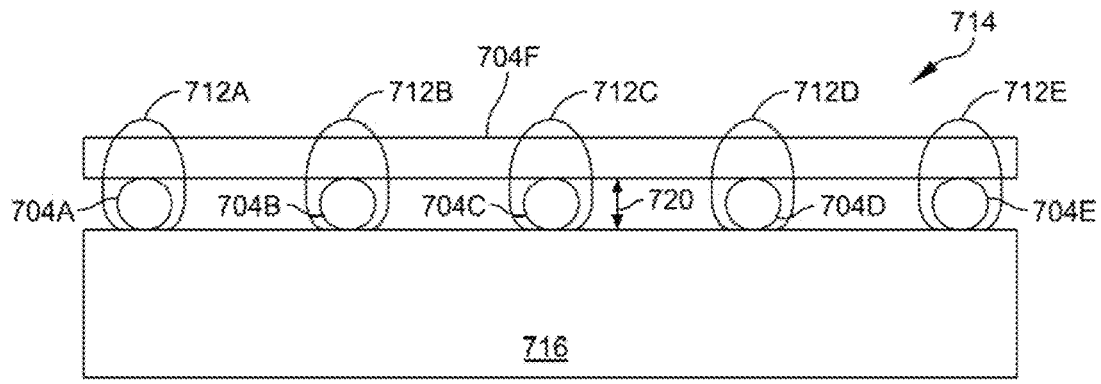
FIG. 7C illustrates a cross-sectional view of the nanofiber fabric of FIGS. 7A and 7B that has been removed from the frame and disposed on a substrate, in an embodiment.

FIGS. 7A, 7B, and 7C illustrate an analogous example to FIGS. 6A, 6B, and 6C except that the adhesive is selectively applied to different locations.

Turning first to FIG. 7A and concurrently to FIG. 7B (which is a cross-section of FIG. 7A at the indicated location), the nanofiber fabric 700 includes nanofiber yarns 704, a frame 708, and selectively applied accumulations of adhesive 712. The nanofiber fabric 700 is, as with the case of nanofiber fabric 600, analogous to the fabric described above in the context of FIG. 5B.

Unlike the nanofiber fabric 600, the nanofiber fabric 700 has accumulations of adhesive 712 disposed at junctions between the nanofiber yarns disposed in a first direction and the nanofiber yarns that are disposed in the second direction. These accumulations are identified in FIG. 7A as circles at intersections between horizontal and vertical yarns and denoted as 712A, 712B, 712C, 712D, and 712E in FIG. 7B. This selective disposition of adhesive on the nanofiber fabric 700 increases the amount of adhesive surface area and the number of adhesive contact points between the nanofiber fabric 700 and an underlying substrate 716, shown in FIG. 7C. Even though the number of adhesive accumulations 712 and the adhesive surface area have increased, as is apparent upon inspection of the figures, a majority of the surface area of the nanofiber yarns (e.g., greater than 50% of the surface area of the nanofibers/nanofiber yarns) as well as the spaces between the nanofiber yarn 704 are free of adhesive. This provides many of the same advantages described above in the context of the nanofiber fabric 600.

In some examples, a thickness of the accumulations 712 can be from 0.1 µm to 1 mm thick. In some examples, a thickness of the accumulations 712 can be from 1% greater to 1000% greater than a thickness of an adhesive layer on a portion of the nanofiber yarn that does not correspond to a junction. In some examples, the dimensions (i.e., the thickness of the adhesive measured from a surface of the nanofiber yarn to a surface of the accumulation 712 exposed to an ambient atmosphere) can be within any of the following ranges: 1 µm to 1 mm; 10 µm to 1 mm; 10 µm to 100 µm; 100 µm to 500 µm; 500 µm to 2 mm; 1 mm to 10 mm; more than 10 mm.

One method for applying the adhesive to the nanofiber fabric 700 begins with the dissolution of adhesive in a solvent. The adhesive solvent solution can then be sprayed as an aerosol onto the nanofiber fabric 700. The size of the adhesive accumulations at junctions between nanofiber yarns oriented in a first direction and a second direction, and the extent to which adhesive becomes disposed on nanofiber yarn surfaces depends on a variety of factors of the aerosol. These factors include, but are not limited to, the adhesive molecule concentration in the solvent, the volatility of the solvent itself, and the pressure of the carrier gas used to apply the solution, among others. But regardless of these factors, under the conditions described herein the adhesive aerosol can primarily accumulate at the junctions indicated in FIGS. 7A and 7B. In still other examples, portions of the nanofiber fabric 700 can be masked so as to prevent adhesive deposition.

Figure 8A:
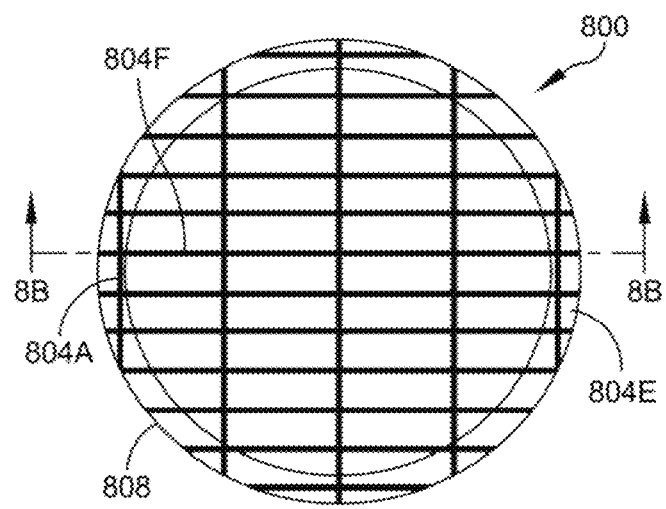
FIGS. 8A and 8B illustrate a plan view and a cross-sectional view, respectively, of a freestanding nanofiber fabric adhered to a frame, wherein the nanofibers of the nanofiber fabric have been infiltrated with adhesive, in an embodiment.
Figure 8B:
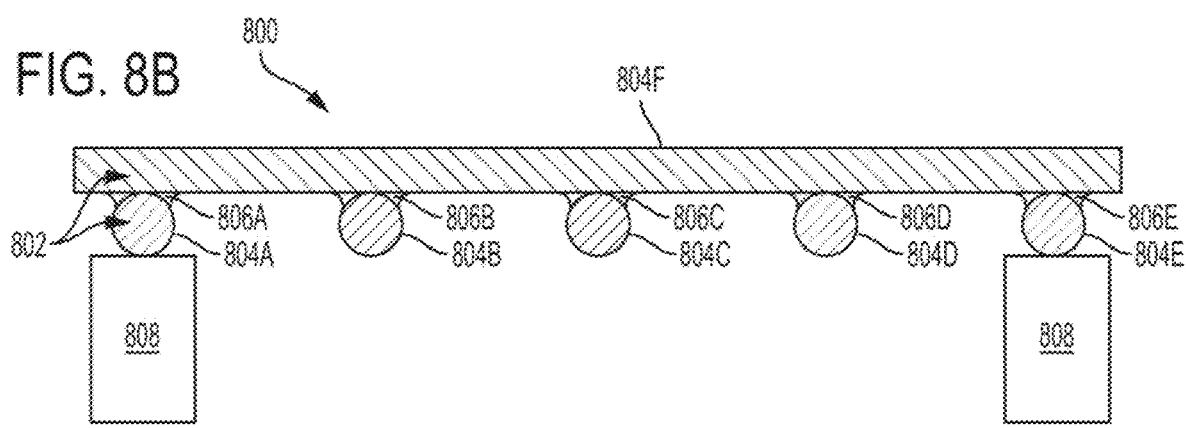
Figure 8C:
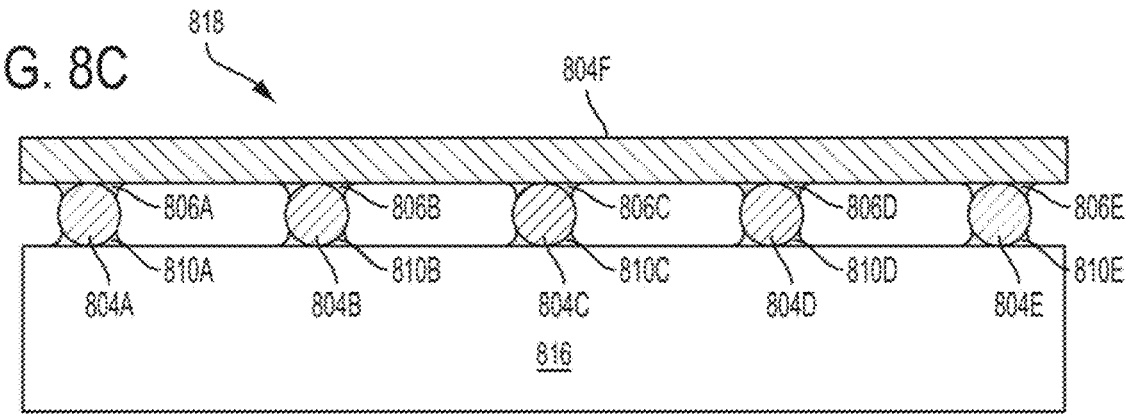
FIG. 8C illustrates a cross-sectional view of the nanofiber fabric of FIGS. 8A and 8B that has been removed from the frame and disposed on a substrate, in an embodiment.

FIGS. 8A, 8B, and 8C illustrate still another example of selectively depositing adhesive on the nanofiber fabric. Analogous to the other examples presented above, FIG. 8A includes a nanofiber fabric 800 with nanofiber yarns 804 oriented in a first direction and a second direction. This example shows the nanofiber fabric disposed on a frame 808. Unlike the examples presented above however, the adhesive in the nanofiber fabric 800 is not disposed merely at junctions between nanofibers and/or between nanofibers and the frame. Rather, the nanofiber yarns 804 of the nanofiber fabric 800 have been infiltrated with adhesive 802, as indicated by the patterning of nanofibers 804, 806 in FIGS. 8B and 8C. Infiltration of materials, including organic molecules such as adhesive 802, can occur by the dissolution of the adhesive in a solvent and application of the solution to the nanofibers. The solvent carries the adhesive (or other material) into an interior of the nanofiber yarn. The interior of a nanofiber and/or nanofiber yarn includes gaps and other interstices between the constituent nanofibers. The solvent is then removed (by heating, vacuum, evaporation, or combinations thereof) leaving the adhesive 802 (or other molecule, particle, or material) disposed within, and in some cases on, the nanofiber yarn.

In some examples, adhesive (or polymer) disposed on a surface of the nanofibers yarns 804 can be removed using negative pressure (i.e., a vacuum) and/or a focused stream of high pressure gas (e.g., nitrogen, argon, air, or other compressed gas or mixture of gases). These techniques are described in more detail in U.S. application Ser. No. 16/051,586, which is incorporated by reference herein in its entirety and included in Appendix 1. Removing adhesive (or polymer) from a surface of the yarns 804 thus provides an adhesive-free yarn surface and enables direct contact to be established between the nanofiber fabric 800 and an underlying substrate, as described above.

The adhesive can then flow through or along fibers in a liquid, flowable state. This can be done before or after removal of the carrier solvent, such as by subsequent application of a solvent by heating above a glass transition temperature of the adhesive (or polymer) molecule, or by applying centrifugal force, such as by rotation. Causing the adhesive within the nanofiber yarns 804 to flow can, in some examples, cause adhesive fillets 806 to form between adjacent nanofiber yarns 804 that are in contact with one another. These are shown in FIGS. 8B and 8C as fillets 806A, 806B, 806C, 806D, and 806E. A thickness (a largest distance between confronting surfaces of the yarns 804F and 804A-804E, 806A-806E, 810A-810E) can be within any of the following ranges: 10 nm to 100 nm; 10 nm to 500 nm; 50 nm to 200 nm; 100 nm 500 nm; 1 µm to 1 mm; 10 µm to 1 mm; 10 µm to 100 µm; 100 µm to 500 µm; 500 µm to 2 mm; 1 mm to 10 mm; more than 10 mm.

The nanofiber fabric 800 can then be transferred from the frame 808 and underlying substrate 816. Whether caused by subsequent application of a solvent, heat, or other mechanism, some of the adhesive disposed within the nanofibers 804 can flow from the nanofibers so as to contact substrate 816. This then forms fillets 810A, 810B, 810C, 810D, and 810E. Once attached to the substrate 816, the nanofiber fabric 800, the adhesive 802, and fillets 806 and 810 can be referred to as the assembly 818.

Adhesives in any of the embodiments described above can include, but are not limited to, acrylic adhesives, pressure sensitive adhesives, thermally activated adhesives, thermoplastic polymers, epoxide or network cured polymers, elastic polymers, combinations thereof, among others. In some embodiments, sol-gel precursor materials can be used instead of traditional organic adhesives. These precursor materials can then be reacted in situ to form a bond with the substrate, even for substrates that are chemically inert and they may not adhere well to conventional adhesives (e.g., ceramic, glass, or glass ceramic substrates). Embodiments that include a sol-gel precursor are described below in more detail.

While many of the embodiments described above include nanofiber yarns of a first plurality that are disposed at an angle to nanofiber of a second plurality, this need not be the case. In one embodiment, a nanofiber fabric includes an array of parallel nanofiber yarns that include adhesive at terminal ends that overlap with a support frame, analogous the embodiment illustrated in FIG. 6A. In one embodiment, a nanofiber fabric includes an array of parallel nanofiber yarns that have been infiltrated with an adhesive, analogous the embodiment illustrated in FIG. 8A.

Sol-Gel Adhesive Embodiments

Any of the foregoing embodiments can use sol gel precursors as the "adhesive" material selectively disposed at terminal ends of nanofiber yarns that overlap a frame (e.g., as shown in FIG. 6A), at junctions between nanofiber yarns oriented in a first direction and nanofiber yarns oriented in a second direction (e.g., as shown in FIG. 7A), and/or infiltrated within some or all of portions of nanofiber yarns (e.g., as shown in FIG. 8A). In one example, sol gel precursors are applied in any of the foregoing configurations to a nanofiber fabric (as also described above) prior to application to a substrate. The nanofiber fabric can be optionally disposed on a release liner for transport or storage. Regardless, when the nanofiber fabric is applied to a substrate to which the sol gel reaction product can be adhered, the sol gel reaction is initiated. In examples, the precursors include those that, when reacted, form silicon dioxide ($SiO_2$), aluminum oxide ($Al_2O_3$), yttrium oxide, and zinc sulfide, among others.

A ceramic adhesive used in this way provides a more durable connection between nanofiber yarns and between the nanofiber fabric and the substrate, thus maintaining the orientation and position of the yarns relative to each other and of the fabric to the substrate regardless of the ambient temperature or the presence of solvents or oxidizers. This can be beneficial for high temperature applications where a polymeric adhesive might flow at temperature proximate to a glass transition temperature or in an environment in which the polymer is solvated or degraded.

In one example method of using sol gel as an attachment (rather than a polymer or oligomer-based adhesive) begins by dissolving the sol gel precursor(s) in a solvent, for example, an alcohol such as ethanol or butanol. The solution of sol gel precursor and solvent is then applied to the nanofiber(s) and/or nanofiber yarn(s). As described above, the sol gel precursor and solvent can in some cases accumulate disproportionally at junctions of nanofibers (and nanofiber yarns) and/or infiltrate into inter-fiber gaps defined by individual nanofibers of a nanofiber yarn (or collection of nanofibers). Regardless, the method continued by applying the combined sol gel precursor, solvent, and nanofiber (yarn) assembly to the substrate and drying the assembly on the substrate, thus causing the solvent to evaporate and the precursors to react. Upon reacting, the precursors form a mechanical connection between the nanofiber yarn and the substrate, as described above. The dimensions of the reacted sol gel precursors can be within any of the ranges described above.

In another example, a nanofiber (yarn) assembly can be electrically insulative. This can be accomplished by applying a ceramic sol gel precursor(s) to some or all of a substrate (e.g., at portions in which the nanofiber fabric will contact the substrate), curing the precursors to form a ceramic, and then applying the fabric to the substrate.

Graphene Attachment Embodiments

Figure 9A:
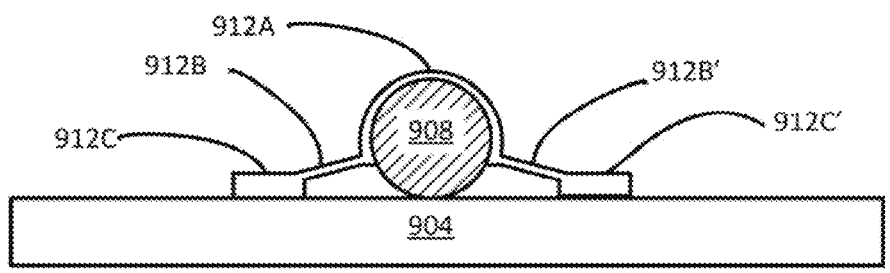
FIG. 9A is a schematic cross-sectional view of a nanofiber connected to a substrate by a graphene sheet, in an embodiment.
Figure 9B:
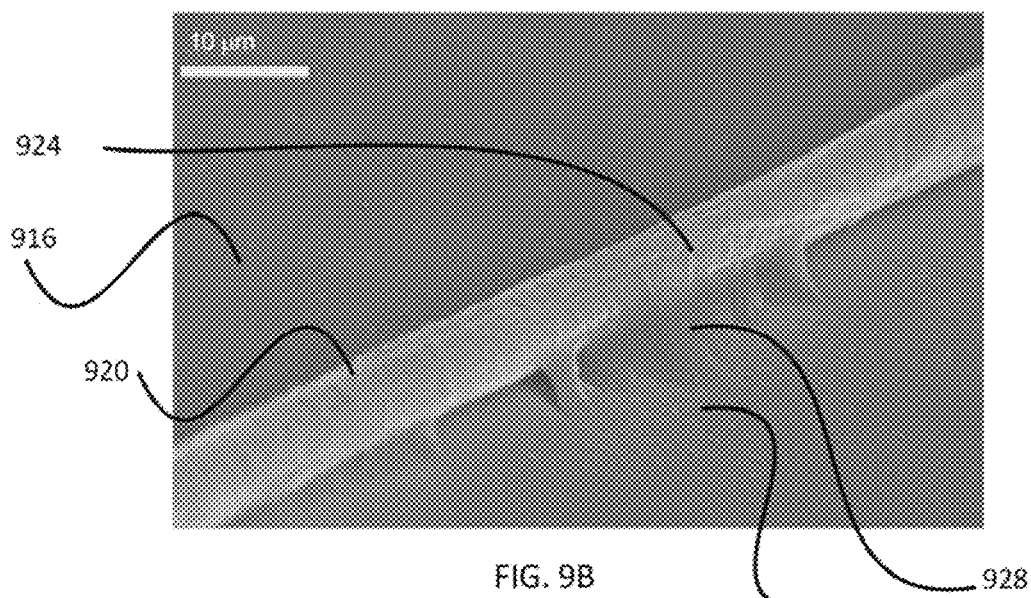
FIGS. 9B and 9C are scanning electron microscope (SEM) images of a graphene sheet connecting a nanofiber to a substrate, in an embodiment.
Figure 9C:
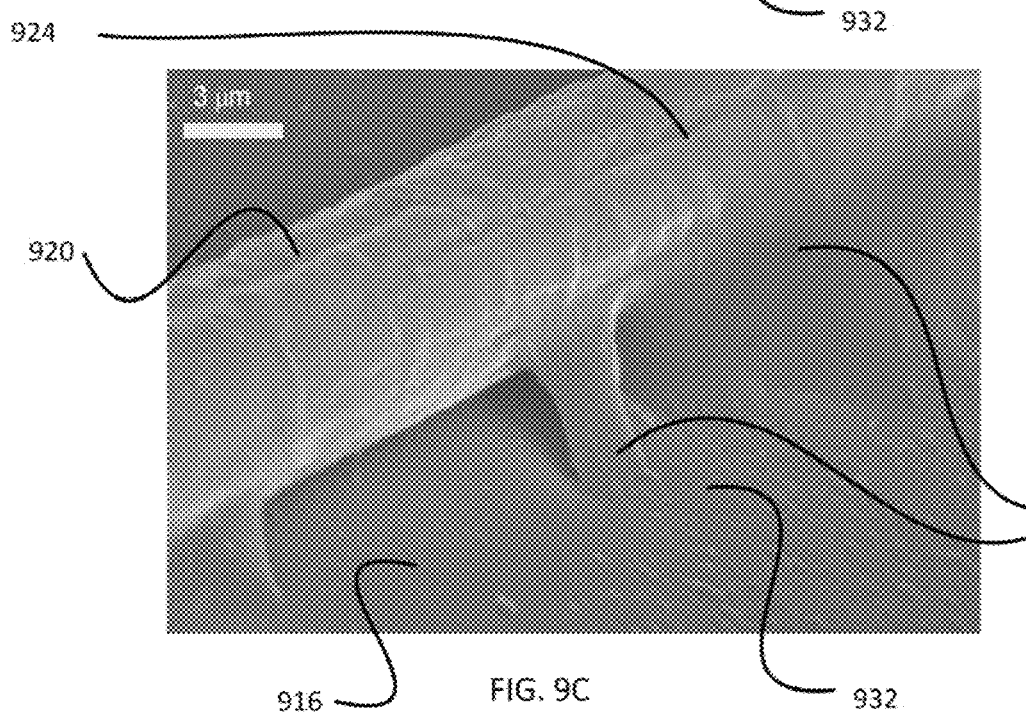

FIGS. 9A, 9B, and 9C illustrate some examples in which a graphene sheet is used to connect a nanofiber yarn to an underlying substrate. In these examples, a graphene sheet can be applied to a nanofiber yarn so that a center portion of the graphene sheet conforms to a portion of the exterior surface of the nanofiber yarn, and opposite end portions of the graphene sheet connect to an underlying substrate on opposite sides of the nanofiber yarn. Van der Waals forces can then cause attraction between the graphene sheet and the underlying substrate, thus acting as a physical constraint to the nanofiber yarn that can be free of an adhesive.

FIG. 9A is a schematic cross-sectional illustration (taken perpendicular to a length of a nanofiber) of one example of this scenario, which includes a substrate 904, a nanofiber 908, and a graphene sheet 912. As shown, the nanofiber 908 is disposed on a surface of the substrate 904. The graphene sheet 912 is illustrated as having three sections: (1) a center portion 912A; (2) first and second side portions 912B and 912B'; and (3) first and second end portions 912C and 912C'. As shown, the center portion 912A is disposed on a surface of the nanofiber 908. First and second end portions 912C and 912C' are in contact with the substrate 904. The first and second side portions 912B and 912B' connect the center portion 912A with the corresponding first and second end portions 912C and 912C'. In this way, as described above, the nanofiber 908 can be connected to the substrate 904 without using an adhesive or sol-gel system, as described above.

FIGS. 9B and 9C (the latter of which is an enlarged view of a portion of FIG. 9B) provide images of an experimental example of the illustration presented in FIG. 9A. In these images, a nanofiber yarn 920 is shown disposed on a surface of a substrate 916. Center portion 924 of a graphene sheet is disposed on the nanofiber yarn 920, analogous to the center portion 912A illustrated in FIG. 9A. It will be appreciated that because of the extreme thinness of graphene sheets (in this case, corresponding to one or two atomic layers of carbon atoms), the center portion 924 of the graphene sheet(s) in this example conforms to the surface topography of the nanofiber so as to be nearly indistinguishable from one another. The physical boundaries between the center portion 924 of the graphene sheet(s) and the nanofiber are more readily discernable in FIG. 9C than in FIG. 9B. For the same reason, the end portion 932 of the graphene sheet that is contact with the substrate 916, acting as an "anchor" for other portions of the graphene sheet, is discernable primarily as a collection of surface irregularities in the images of FIGS. 9B and 9C. The side portion 928 connects the center portion 924 to the end portion 932, thus enabling the graphene sheet to pin, connect, or otherwise fix the nanofiber 920 to the substrate 916 without using an adhesive or sol-gel precursors.

In some examples, a method for using graphene to attach a nanofiber (and/or nanofiber yarn) to a substrate begins by suspending graphene particles (which are generally one atomic layer of carbon thick, but in some cases can be up to 5 or 10 atomic layers thick) in a solvent. Examples of solvents include water, ethanol, and butanol, among others. The method continues by spraying the suspension of graphene sheets and solvent via an aerosol onto the nanofibers. While not wishing to be bound by theory, it is believed that capillary forces draw graphene sheets over a surface of a nanofiber yarn (as illustrated and depicted above), thus connecting the graphene sheet to the substrate. The graphene sheet can conform to at least a portion of a surface of the nanofiber sheet and connect to the underlying substrate. This has the effect of fixing, attaching or otherwise connecting the nanofiber (or nanofiber yarn) to the substrate.

Applications

Any of the preceding example embodiments can be used in the following applications. In one application, a nanofiber fabric of the present disclosure can be adhered to an interior or exterior of a casing to provide electromagnetic interference (EMI) shielding to composed disposed within the case. In some cases, the nanofiber fabric acts as a barrier to EMI in the gigahertz range and to EMI that is polarized and not polarized. In another example, embodiments of the present disclosure, including those conveniently applied using a release liner, can be used to establish or re-establish electrical contact in an open circuit. For example, a portion of a nanofiber fabric of the present disclosure comprising nanofiber yarns oriented in different directions, can be adhered to conductors on opposing sides of an opening the circuit. Because of the two dimensional network of conductive nanofiber yarns can make physical and electrical contact with the conductors not impeded by an intervening insulating adhesive, the circuit can be closed. In this way, embodiments herein can be used as a conductive "patch" to a circuit. In some examples, embodiments herein can be used in an electrically resistive capacity, thus acting as a heating element.

Any of the embodiments described herein may be initially disposed on, or between, a release layer (or release layers) to facilitate storage and subsequent application to a substrate. In some examples, the release liners can be thin (i.e., less than 0.5 mm thick), flexible and/or elastically or plastically deformable substrates (e.g., polyethylene, plastically deformable polydimethylsiloxane (PDMS), metal foil, thermoplastic polymer films, among others) that comprise a weak adhesive or an adhesive with a low surface energy material between the adhesive and the nanofiber fabric of the present disclosure. In one example, a thermoplastic film can be heated to softening and the nanofiber yarns and/or nanofiber fabric can be partially embedded (e.g., less than half a thickness or less than one quarter of the thickness of the yarn and/or fabric) so that the yarn and/or fabric is temporarily fixed within the thermoplastic film when cooled, but still easily removed after adhering the opposing surface of the nanofiber fabric to the substrate. In this way, embodiments described herein can be fabricated and stored between release liner layers indefinitely. When needed, one layer of release liner can be removed to expose the adhesive selectively disposed on the nanofiber fabric. The nanofiber fabric and a remaining deformable release layer can then be conformed to a substrate, even a substrate having a three dimensional topography, without disturbing the orientation and/or position of the nanofiber yarns relative to one another, as described above.

One convenient aspect of using a release liner is that long lengths of nanofiber fabric (e.g., 50 centimeters or more) can be wrapped around a spool. Because the release liner separates adjacent layers of nanofiber fabric and corresponding adhesive from one another the nanofiber fabric can be stored, transported, and used in a physically compact form (i.e., many meters of nanofiber fabric and release liner wound around a spool having a diameter on the order of centimeters) without disturbing the adhesive accumulations.

Any of the embodiments described herein may also include particles or flakes of materials within or on the adhesive accumulations. For example, silver nanoparticles, graphene flakes, carbon nanoparticles (e.g., fullerenes), inorganic fillers (e.g., micron sized particles of silica or carbon) may also be mixed with, added to, or put on the adhesive accumulation and/or adhesive filled nanofiber yarns as described herein. These particles can improve adhesion between the nanofiber fabric and the substrate, improve the mechanical properties of the adhesive connection between the nanofiber fabric and the substrate, improve the mechanical properties (e.g., the adhesive strength) between the nanofiber yarns of the nanofiber fabric, improve the electrical, physical, and/or thermal contact between the nanofiber fabric and the substrate, among other benefits.

In another example, a film of single-walled nanotubes can be used to adhere a nanofiber fabric to the substrate. Single-walled carbon nanotubes have strong van der Waals forces that can cause or facilitate adhesion between surfaces in contact with opposing sides of the film of single-walled nanotubes. A plurality of single-walled nanotubes in a range of from 1 nm to 3 nm thick can be suspended in a solution of surfactant and water. This suspension can then be filtrated (or the water/surfactant solution otherwise removed) to create a film of nanotubes. The film of nanotubes can then be applied to the nanofiber fabric. The nanofiber fabric is placed onto the substrate, sandwiching the nanofiber film between the nanofiber fabric and the substrate. The single-walled nanotube film is thus situated to encourage adhesion between the nanofiber fabric and the substrate.

Further Considerations

The foregoing description of the embodiments of the disclosure has been presented for the purpose of illustration; it is not intended to be exhaustive or to limit the claims to the precise forms disclosed. Persons skilled in the relevant art can appreciate that many modifications and variations are possible in light of the above disclosure.

The language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the invention, which is set forth in the following claims.

What is claimed is:

1. A nanofiber fabric comprising:
a first plurality of nanofibers oriented in a first direction;
a second plurality of nanofibers oriented in a second direction different from the first direction, the second plurality of nanofibers in contact with the first plurality of nanofibers at a plurality of junctions; and
adhesive accumulations on at least some of the plurality of junctions,
wherein:
at least one of the first plurality of nanofibers and the second plurality of nanofibers comprise single walled carbon nanotubes; and
one of the first plurality of nanofibers and the second plurality of nanofibers, when conforming to a three dimensional topography, is configured to maintain its orientation to the other plurality of nanofibers.

2. The nanofiber fabric of claim 1, wherein the nanofibers of at least one of the first plurality and the second plurality comprise coiled nanofiber yarns and wherein coils of the coiled nanofiber yarns enable at least some of the first plurality of nanofibers and the second plurality of nanofibers to maintain their orientation and position relative to one another by at least partially uncoiling when placed in contact with a substrate having a three dimensional topography.

3. The nanofiber fabric of claim 1, further comprising:
a frame, wherein at least some terminal ends of the first plurality of nanofibers and the second plurality of nanofibers are disposed; and wherein the adhesive accumulations are on at least some terminal ends of the first plurality of nanofibers and the second plurality of nanofibers, the terminal ends disposed on the frame.

4. The nanofiber fabric of claim 1, wherein the nanofiber fabric acts as a barrier to at least one of electromagnetic interference and IR radiation.

5. The nanofiber fabric of claim 1, further comprising a plurality of nanofiber yarns disposed on the adhesive accumulations, wherein the nanofiber yarns are twisted and coiled nanofibers.

6. The nanofiber fabric of claim 5, wherein twists and coils of the nanofiber yarns enable the plurality of nanofibers yarns to maintain their orientation and position relative to one another by at least partially uncoiling when placed in contact with a substrate having a three dimensional topography.

7. A nanofiber fabric comprising:
   a release liner comprising a backing material and a first adhesive have a first adhesive strength;
   a plurality of nanofiber yarns disposed on the first adhesive of the release liner, wherein the nanofiber yarns are twisted and coiled nanofibers; and
   a second adhesive having a second adhesive strength greater than the first adhesive strength disposed on at least one of a surface of the nanofiber yarns of the plurality or within interiors of the nanofiber yarns between the twisted and coiled nanofibers,
   wherein the release liner comprises a deformable sheet configured to deform to conform to a substrate having a three dimensional topography.

8. The nanofiber fabric of claim 7, wherein the plurality of nanofibers comprises a first plurality of parallel nanofibers oriented in a first direction and a second plurality of parallel nanofibers oriented in a second direction.

9. The nanofiber fabric of claim 8, wherein an angle between the first direction and the second direction is from 45° to 135°.

10. The nanofiber fabric of claim 8, wherein an angle between the first direction and the second direction is from 60° to 120°.

11. The nanofiber fabric of claim 7, wherein the nanofiber fabric is transparent to IR radiation.

12. The nanofiber fabric of claim 7, wherein the nanofiber fabric acts as barrier to electromagnetic interference.

13. The nanofiber fabric of claim 7, wherein twists and coils of the nanofiber yarns enable the plurality of nanofibers yarns to maintain their orientation and position relative to one another by at least partially uncoiling when placed in contact with a substrate having a three dimensional topography.

14. The nanofiber fabric of claim 7, wherein the first adhesive has an adhesive energy of less than 40 dynes/cm, the release liner on at least one side of the nanofiber fabric.

15. The nanofiber fabric of claim 7, wherein one or more of the first adhesive and the second adhesive comprises sol gel precursors.

16. The nanofiber fabric of claim 15, wherein the sol gel precursors comprise silicon dioxide precursors and a solvent.

17. The nanofiber fabric of claim 15, wherein the sol gel precursors comprise a solvent and at least one of aluminum oxide precursors and yttrium oxide precursors.

18. The nanofiber fabric of claim 15, wherein the sol gel precursors comprise zinc sulfide precursors and a solvent.

19. A nanofiber assembly comprising:
   a substrate;
   a nanofiber disposed over the substrate; and
   a graphene sheet having a center portion, a first side portion and a second side portion on opposite sides of the center portion, a first end portion connected to the first side portion and a second end portion connected to the second side portion,
   wherein:
   the center portion of the graphene sheet is in contact with a side of the nanofiber opposite the substrate,
   the center portion conforms to a surface topography of the nanofiber, and
   the first and second end portions are in contact with the substrate.

20. The nanofiber fabric of claim 1, wherein at least one of the first plurality of nanofibers and the second plurality of nanofibers further comprises multi-walled carbon nanotubes.

* * * * *